United States Patent
Ishii et al.

(10) Patent No.: US 6,322,662 B1
(45) Date of Patent: Nov. 27, 2001

(54) PLASMA TREATMENT SYSTEM

(75) Inventors: Nobuo Ishii, Minoo; Yasuo Kobayashi; Tamotsu Morimoto, both of Yamanashi-ken; Makoto Ando, 1-1-I-312, Ogura, Saiwai-ku, Kawasaki-shi, Kawasaki-Ken; Naohisa Goto, 2-8-1, Shiroyamate, Hachioji-shi, Tokyo-to, all of (JP)

(73) Assignees: Tokyo Electron Limited, Tokyo; Makoto Ando, Kanagawa-ken; Naohisa Goto, Tokyo, all of (JP)

( * ) Notice: Subject to any disclaimer, the term of this patent is extended or adjusted under 35 U.S.C. 154(b) by 0 days.

(21) Appl. No.: 09/494,031

(22) Filed: Jan. 31, 2000

(30) Foreign Application Priority Data

Feb. 1, 1999 (JP) ................................................ 11-023454

(51) Int. Cl.⁷ .............................. H05H 1/00; C23C 16/00
(52) U.S. Cl. ................................ 156/345; 118/723 MW; 118/723 AN
(58) Field of Search .................... 156/345; 118/723 MW, 118/723 ME, 723 MR, 723 E, 723 AN

(56) References Cited

U.S. PATENT DOCUMENTS

| | | | |
|---|---|---|---|
| 5,342,472 | * | 8/1994 | Imahashi et al. ............... 204/298.38 |
| 5,545,258 | * | 8/1996 | Katayama et al. ............ 118/723 MP |
| 5,698,036 | | 12/1997 | Ishii et al. . |
| 5,804,923 | * | 9/1998 | Iio et al. .......................... 315/111.21 |
| 5,874,706 | * | 2/1999 | Ishii et al. ........................ 219/121.43 |
| 5,911,852 | * | 6/1999 | Katayama et al. .................... 156/345 |
| 5,951,887 | * | 9/1999 | Mabuchi et al. ................ 219/121.43 |
| 5,988,104 | * | 11/1999 | Nambu ......................... 118/723 MW |

FOREIGN PATENT DOCUMENTS

| | | |
|---|---|---|
| 8-111297 | 4/1996 | (JP) . |
| 9-181052 | * 7/1997 | (JP) ............................... C23C/16/00 |

* cited by examiner

*Primary Examiner*—Gregory Mills
*Assistant Examiner*—P. Hassanzadeh
(74) *Attorney, Agent, or Firm*—Finnegan, Henderson, Farabow, Garrett & Dunner LLP

(57) ABSTRACT

In a plasma treatment system, the increase of the electric field of a treatment space facing the central portion of a flat antenna member is relieved, and the ununiformity of the density of plasma in a plasma forming region is relieved.

Microwave generated by a microwave generator 50 are supplied from a waveguide 52 to a flat antenna member 44. The flat antenna member 44 has a plurality of slots 60. The space between adjacent two of the slots 60 is longer than the guide wavelength of microwaves in the waveguide 52, and the length of each of the slots 60 is shorter than half of the guide wavelength. The slots 60 are arranged in a region other than the central portion of the flat antenna member 44 so as not to be axisymmetric.

6 Claims, 15 Drawing Sheets

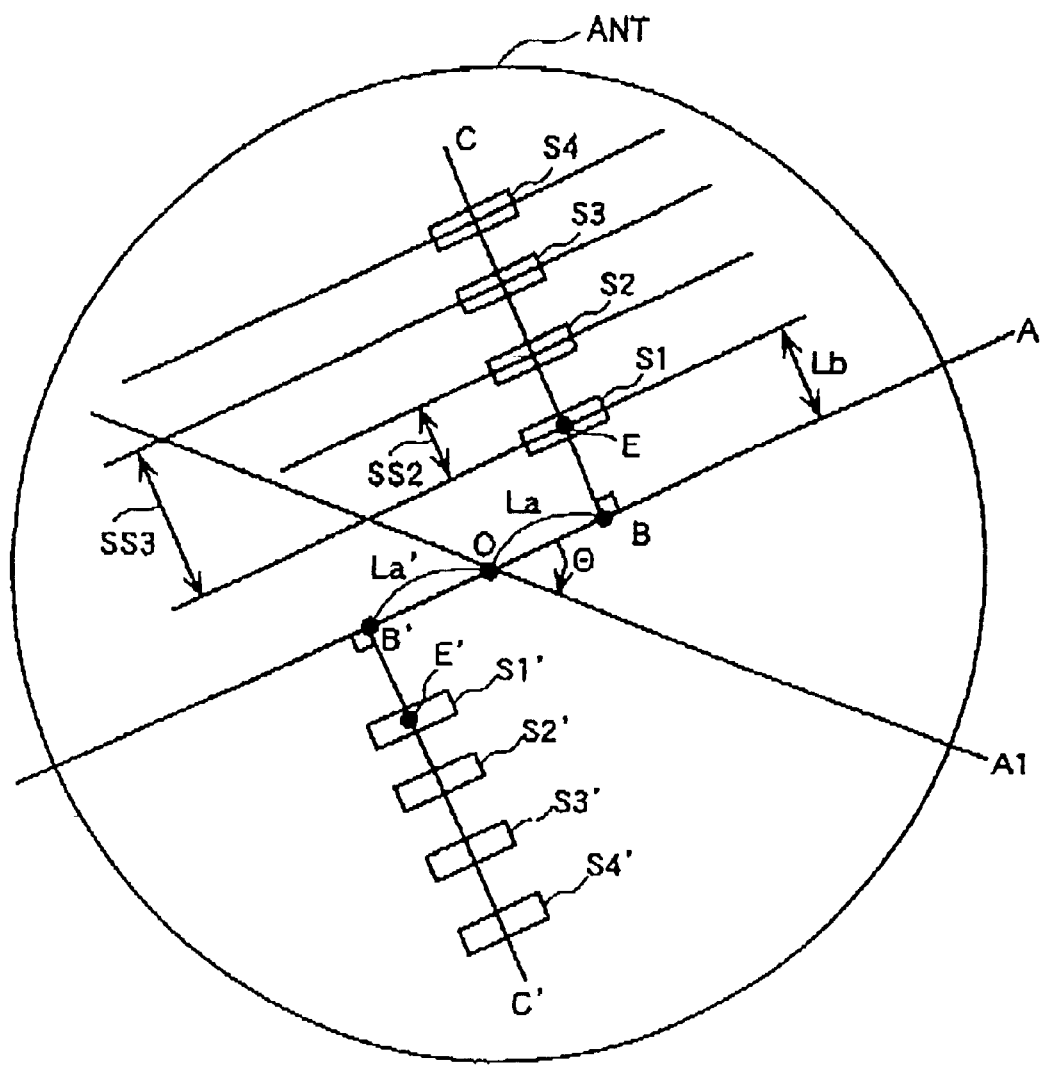
F I G. 3

PLASMA TREATMENT SYSTEM

BACKGROUND OF THE INVENTION

1. Field of the Invention

The present invention relates generally to a plasma treatment system suitable for a treatment, such as CVD, etching, sputtering or ashing.

2. Description of the Prior Art

In recent years, with the densification and high definition of semiconductor products, a plasma treatment system for performing a treatment, such as thin-film deposition, etching or ashing, is used in a process for producing semiconductor products.

Conventionally, as plasma treatment systems of this type, there are known a system wherein a microwave inlet is provided in a plasma producing chamber having a magnetic field forming means to form an electron cyclotron resonance cavity to draw ions from the plasma producing chamber to irradiate a semiconductor wafer with ion beams in a reaction chamber (Japanese Patent Publication No. 58-13626), and a system for introducing microwaves into a cavity resonator from one end thereof through a waveguide to radiate microwaves into a plasma producing chamber from a slot provided at the other end of the resonator (Japanese Patent Laid-Open No. 63-293825).

However, since the system disclosed in Japanese Patent Publication No. 58-13626 has the plasma producing chamber and the reaction chamber, there is a problem in that the size of the whole system is great. In addition, since the system disclosed in Japanese Patent Laid-Open No. 63-293825 has the cavity resonator and the plasma producing chamber, there is the same problem.

On the other hand, in a plasma treatment system wherein a circular microwave radiating plate member (a flat antenna member) having spirally or concentrically arranged slots is mounted on the tip of a coaxial guide to be arranged in a vacuum vessel (a treatment vessel) having a discharge space and wherein a sample, such as a semiconductor wafer, arranged in the vacuum vessel so as to face the microwave radiating plate member is irradiated with microwaves (Japanese Patent Laid-open No. 1-184923 and 8-111297), it is possible to miniaturize the whole system since the vacuum vessel itself has a cavity resonator structure.

However, in the above described system disclosed in Japanese Patent No. 8-111297, there is a problem in that it is not possible to input an electric power higher than some extent even if a great electric power is intended to be input in order to obtain a high density plasma.

Therefore, the inventors have proposed a plasma treatment system for solving this problem in Japanese Patent Application No. 8-153357 (Japanese Patent Laid-Open No. 9-181052). In this plasma treatment system, the length of each of slots formed in a flat antenna member and the space between adjacent two of the slots are different from those of the above described system disclosed in Japanese Patent Laid-Open No. 8-111297, so that an electric field exponentially attenuating as leaving the surface of the flat antenna member can be formed in a treatment space in a treatment vessel. The radial space between adjacent two of the slots of the flat antenna member is set to be preferably in the range of from 5% to 50% of the coaxial guide wavelength of microwaves (substantially the same value as the coaxial guide wavelength in the case of the plasma treatment system disclosed in Japanese Patent Laid-Open No. 8-111297), and the length of each of the slots is set to be preferably in the range of ($\frac{1}{2}$)±30% of the coaxial guide wavelength (in the range of from about $\frac{1}{2}$ of the coaxial guide wavelength to about $\frac{1}{2}$ of a free space wavelength in the case of the plasma treatment system disclosed in Japanese Patent Laid-Open No. 8-111297).

According to the plasma treatment system with this construction, since an electric power for producing plasma is inputted via an electrostatic field, not via an electromagnetic field, there is no upper limit to the input electric power, so that it is possible to efficiently the electric power.

However, it was revealed that, in this plasma treatment system, there is a problem in that the intensity of the electric field in the treatment space facing the central portion of the flat antenna member increases. The inventors consider that the reason for this is as follows. The microwaves supplied from the inner conductor of the coaxial waveguide to the center of the flat antenna member propagate in radial directions while being radiated into the treatment space via the slots. Since the space between adjacent two of the slots is set to be the above described value in this plasma treatment system, a very small amount of microwaves are radiated radially outside via the slots. Therefore, most of the microwaves reflect on a radial edge (the inner wall surface of a radial waveguide box of a conductive material) to be returned. Then, the returned microwaves are radiated radially inside via the slots. Since the normal line of each of the slots formed-in the flat antenna member passes through the center of the flat antenna member, the microwaves radiated from the slots concentrate on the treatment space facing the central portion of the flat antenna member, and the intensity of the electric field herein increases.

In addition, in the above described plasma treatment system proposed in Japanese Patent Laid-Open No. 9-181052, it was revealed that the density of plasma directly beneath a quartz glass disposed on the bottom surface of the flat antenna member, i.e., the density of plasma in a plasma forming region, is ununiform. It is considered that the reason for this is that, if the slot pattern formed in the flat antenna member is axisymmetric, the axisymmetric coaxial waveguide resonates with the axisymmetric flat antenna member in an inherent mode. Furthermore, the expression "axisymmetric" means that, like a concentric circle, the shape of the coaxial waveguide or flat antenna member does not change even if it is rotated about the center of the flat antenna member by an optional angle.

SUMMARY OF THE INVENTION

It is therefore an object of the present invention to eliminate the aforementioned problems and to provide a plasma treatment system capable of relieving the increase of the electric field in a treatment space facing the central portion of the flat antenna member by devising the length of each of slots formed in a flat antenna member, the space between adjacent two of the slots and the arrangement thereof.

It is another object of the present invention to provide a plasma treatment system capable of relieving the ununiformity of the density of plasma in a plasma forming region by devising the length of slots formed in a flat antenna member, the space between adjacent two of the slots and the arrangement thereof.

In order to accomplish the aforementioned and other objects, a plasma treatment system comprises: an airtight treatment vessel housing therein a mounting table for mounting thereon an object to be treated; microwave generating device for generating a microwave; microwave introducing device for introducing the microwave into the treatment-vessel; and a flat antenna member which is connected to the microwave introducing device and which faces the mounting table, the flat antenna member having a plurality of slots in a region other than a central portion of the flat antenna member, the slots being arranged so as not to be axisymmetric with respect to an axis passing through the center of the flat antenna member, a space between adjacent two of the slots being shorter than a wavelength of the microwave in the microwave introducing device, and each of the slots having a length shorter than half of the wavelength.

According to the plasma treatment system with this construction, while microwaves supplied from the microwave introducing device to the flat antenna member propagate in radial directions of the flat antenna member, a small amount of microwaves are radiated radially outside via the slots. Most of microwaves reflect on the radial edge to be returned. During this process, the microwaves are radiated radially inside via the slots. Although the microwaves radiated while propagating in the radial directions are synthesized with the microwaves radiated while reflecting to be returned, the electric field of the radiated microwaves is prevented from increasing in the treatment space facing the central portion of the flat antenna member since the slots are arranged so as not to be axisymmetric. The expression "not to be axisymmetric" means that, when the flat antenna member is rotated about an axis passing through the center of the flat antenna member by an optional angle, the flat antenna member before the rotation is not coincident with the flat antenna member after the rotation. The axis passing through the center of the flat antenna member means a line which passes through the center of the flat antenna member and which is perpendicular to the surface of the flat antenna member.

In addition, since the microwaves supplied from the microwave introducing device to the center of the flat antenna member propagate in directions offset from the radial directions of the flat antenna member when being radiated into the treatment space via the slots, it is possible to avoid the resonance of the waveguide 52 with the flat antenna member 44. By these two functions, it is possible to produce uniform plasma onto the mounting table.

Moreover, since the microwaves radiated in radial directions have an electric field component perpendicular to the surface of the antenna member, molecules of a plasma gas supplied into the treatment vessel can be efficiently heated by the electric field component. As a result, the efficiency for absorbing the electric power is improved, so that it is possible to efficiently produce plasma.

According to the present invention, since the slots are arranged in the region other than the central portion of the flat antenna so as not to be axisymmetric, it is possible to relieve the increase of the electric field of microwaves, which are radiated from the flat antenna, in the treatment vessel facing the central portion of the flat antenna member, and it is possible to relieve the ununiformity of the density of plasma in the plasma forming region. Thus, it is possible to produce uniform plasma onto the mounting table. In addition, it is possible to efficiently produce plasma by the electric field component of microwaves radiated substantially in radial directions from the flat antenna member.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 3 is a schematic diagram for explaining an example of a procedure for forming a slot pattern;

DESCRIPTION OF THE PREFERRED EMBODIMENTS

Figure 1:
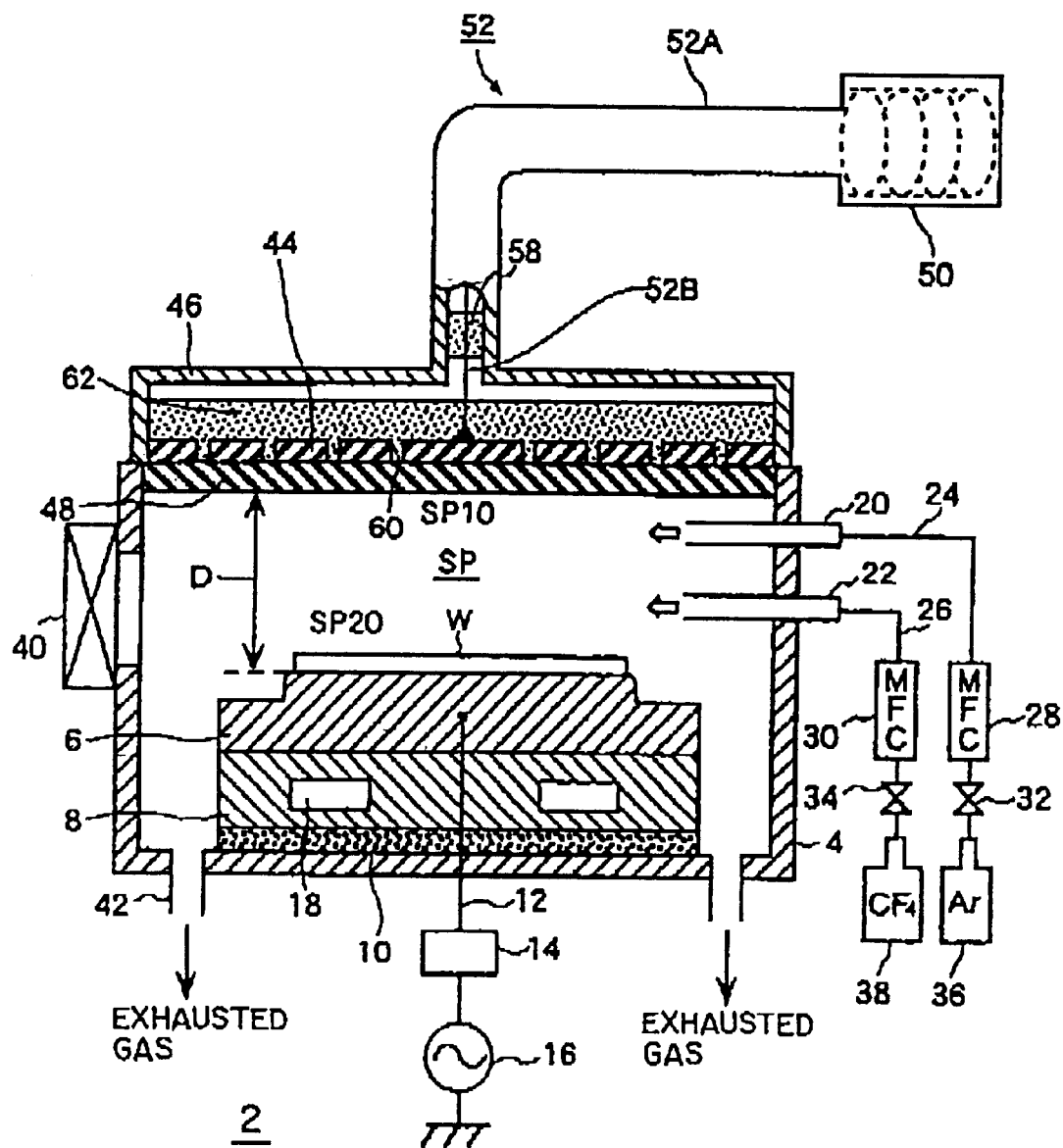
FIG. 1 is a sectional view of a preferred embodiment of a plasma treatment system according to the present invention.

Referring now to the accompanying drawings, a preferred embodiment of a plasma treatment system according to the present invention will be described in detail below. FIG. 1 is a sectional view of a preferred embodiment of a plasma treatment system according to the present invention.

In this preferred embodiment, a plasma treatment system applied to a plasma etching system will be described. As shown in FIG. 1, a plasma etching system 2 has a cylindrical treatment vessel 4 having a side wall and a bottom which are made of a conductive material, such as aluminum. The treatment vessel 4 defines therein a closed treatment space SP.

The treatment vessel 4 houses therein a mounting table 6 for mounting thereon-a semiconductor wafer W serving as an object to be treated. The mounting table 6 is made of aluminum treated with alumite, and has a substantially cylindrical shape having a convex flat central portion. The bottom of the mounting plate 6 is supported on a cylindrical supporting table 8 of aluminum. The supporting table 8 is mounted on the bottom of the treatment vessel 4 via an insulating material 10.

On the top surface of the mounting table 6, an electrostatic chuck and clamp mechanism (not shown) for holding the wafer are mounted. The mounting table 6 is connected to a matching pump 14 and a biasing high-frequency power supply 16 of, e.g., 13.56 MHz, via a feeder 12. The supporting table 8 for supporting thereon the mounting table 6 is provided with a cooling jacket 18 for allowing cooling water to pass therethrough for cooling the wafer during a plasma treatment. The side wall of the treatment vessel 4 is provided with a plasma gas supply nozzle 20 of a quartz pipe for supplying a plasma gas, e.g., argon gas, into the vessel, and a treatment gas supply nozzle 22 of, e.g., a quartz pipe, for introducing a treatment gas, e.g., an etching gas. These nozzles 20, 22 are connected to a plasma gas source 36 and a treatment gas source 38 by means of gas supply paths 24, 26 via mass flow controllers 28, 30 and shut-off valves 32, 34, respectively. The etching gas serving as the treatment gas may be $CF_3$, $CHF_3$ or $CF_4$ gas. The outer periphery of the side wall of the treatment vessel 4 is provided with a gate valve 40 which is open and closed when introducing/discharging the wafer into/from the treatment vessel 4.

Moreover, an outlet 42 connected to a vacuum pump (not shown) is formed in the bottom of the treatment vessel 4 to evacuate the treatment vessel 4 to a predetermined pressure if necessary.

On the other hand, the top of the treatment vessel 4 is provided with a flat antenna member 44 for forming an electrostatic field. The flat antenna member 44 is formed as the bottom of a radial waveguide box 46 of a low cylindrical hollow vessel. The radial waveguide box 46 is arranged so as to face the mounting table 6. The radial waveguide box 46 is substantially disk-shaped and made of a conductive material, e.g., aluminum. Over the whole bottom surface of the antenna member 44, a quartz glass plate 48 having a thickness of, e.g., 2 mm, is airtightly provided as a protective plate for protecting the antenna member 44 from plasma while airtightly holding the interior of the radial waveguide box 46. In place of the quarts glass plate 48, a ceramic thin plate or the like may be used as the protective plate.

One end of the outer tube 52A of a waveguide 52 is connected to the central portion of the top surface of the radial waveguide box 46, and the other end thereof is connected to a microwave generator 50 of, e.g., 2.45 GHz. The inner cable 52B of the waveguide 52 is connected to or slightly spaced from the central portion of the disk-shaped antenna member 44. In the figure, the inner cable 52B is connected to the central portion of the disk-shaped antenna member 44. While the coaxial waveguide has been used as an example of a waveguide, a circular sectional or rectangular waveguide may be used.

At the connecting portion of the waveguide 52 to the radial waveguide box 46, a sealing material 58 of, e.g., a ceramic seal, is airtightly provided in the waveguide 52 by brazing or the like to hold the vacuum in the radial waveguide box 46.

On the other hand, the radial waveguide box 46 houses therein a dielectric 62 having a predetermined dielectric constant for decreasing the wavelength of microwaves, which are supplied to the flat antenna member, to be a shorter guide wavelength. The dielectric 62 may be a material having a small dielectric loss, such as $Al_2O_3$, Al or SiN. The distance D between the bottom surface of the flat antenna member 44 and the top mounting surface of the mounting table 6 is set to be in the range of, e.g., from about 5 cm to about 10 cm, so that the treatment space SP is divided into a plasma forming region SP10 and a process region SP20, in which treatment is actually performed with active species of plasma diffusing from the plasma forming region SP10.

The flat antenna member 44 comprises a disk of a conductive material, e.g., a copper disk, having, e.g., a diameter of 50 cm and a thickness of about 0.1 to 2.0 mm, preferably 0.3 to 1.0 mm.

Figure 2:
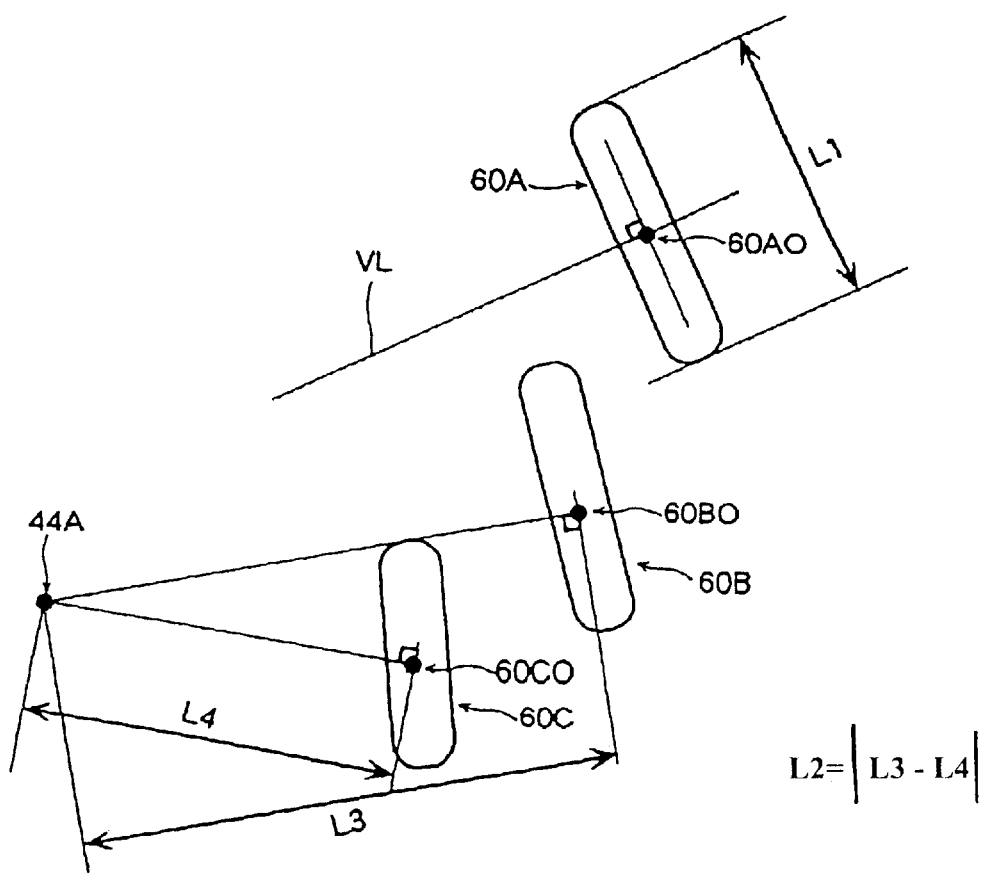
FIG. 2 is a schematic diagram for explaining slots in an antenna member of FIG. 1.

Referring to FIG. 2, the characteristics of slots formed in the flat antenna member 44 will be described below. In this figure, the center 44A of the disk-shaped antenna member 44 and three slots 60A, 60B and 60C are shown.

The length L1 of each slot is set to meet the condition of $0<L1<\lambda g/2$ wherein $\lambda g$ is a waveguide wavelength of microwaves. The lengths of the respective slots are not required to be equal to each other as long as the lengths meet the above described condition. For example, the peripheral portion thereof may be longer than another portion. The length L1 of each slot is set to be preferably in the range of $\lambda g/10 \leq L1 \leq \lambda g/2$.

A slot space L2 is set to meet the condition of $0<L2<\lambda g$. The slot space is defined as the difference between distances between the center 44A of the disk-shaped antenna member 44 and the centers of two slots, one of which is a certain slot selected as a reference slot and the other of which is a slot nearest to the reference slot. For example, in the case of FIG. 2, the space between the slots 60B and 60C is the difference between a distance L3 between the center 60BO of the slot 60B and the center 44A of the disk-shaped antenna member 44 and a distance L4 between the center 60CO of the slot 60C and the center 44A of the disk-shaped antenna member 44. Similar to the length of the slot, the slot spaces are not required to be equal to each other. For example, the peripheral portion may be shorter than other portions. The slot space L2 is set to be preferably in the range of $\lambda g/33 \leq L2 \leq \lambda g/2$, and is set to be more preferably in the range of $\lambda g/20 \leq L2 \leq \lambda g/4$.

The length of each slot is greater than the width thereof. Both end portions of each slot in longitudinal directions are round. The width of each slot is preferably in the range of from 1 to 4 mm.

Each slot is oriented so that the normal line VL thereof does not pass through the central portion of the disk-shaped antenna member 44. The normal line of a slot means a straight line perpendicular to a longitudinal direction of the slot at the center thereof. Thus, since each slot is oriented so that the normal line VL thereof does not pass through the central portion of the disk-shaped antenna member 44, the increase of the electric field in the treatment space facing the central portion of the flat antenna member is relieved even if microwaves reflecting on the inner wall surface of the radial waveguide 46 to be returned pass through the slots to be radiated radially inside. In addition, the fact that each slot is oriented so that the normal line VL thereof does not pass through the central portion of the disk-shaped antenna member 44 means that the slot pattern is not axisymmetric. Therefore, microwaves supplied from the inner conductor 52B of the waveguide 52 to the center of the flat antenna member 44 propagate in directions offset from the radial directions of the flat antenna member 44 when being radiated into the treatment space via the slots. Thus, it is possible to avoid the resonance between microwaves within the radial waveguide box 46 and microwaves radiated through the slot into the closed, treatment space SP so that it is possible to relieve the ununiformity of the density.

Referring to FIG. 3, an example of a method for forming such a slot pattern will be described below. Such a slot pattern may be formed by the following steps (1-1) through (1-8).

(1-1) Draw an optional straight line A passing through the center O of a flat antenna member ANT.

(1-2) Take a point B apart from the center O by a distance La (La>0).
(1-3) Draw a straight line C which passes through the point B and which is perpendicular to the straight line A. For example, the straight line C may only a half counterclockwise with respect to the straight line A.
(1-4) Take a point E on the straight line C so as to be apart from the point B by a distance Lb (Lb≧0).
(1-5) Arrange a slot S1 which passes through the point E and which is perpendicular to the straight line C. It is assumed that the length of the slot S1 is SL1 (SL1>0) and that the point E is the center of the slot S1.
(1-6) Sequentially arrange slots Sx in the opposite direction to the point B with respect to the point E so as to be apart from the point E by a predetermined distance SSx (x is an integer from 2 to N). The slots Sx are arranged to the outermost periphery of the flat antenna member ANT. Furthermore, FIG. 3 shows slots S1 through S4.
(1-7) Take a point B' on the straight line A in the opposite direction to the point B with respect to the point O so as to be apart from the point O by a distance La' (La'>O).
(1-8) carry out the above described steps (1-3) through (1-6) to obtain a straight line C', a point E' and slots Sx' (x' is an integer from 1 to N). The values La, La', Lb and Lb' (Lb' is not shown) are adjusted so that Sx' does not interfere with Sx.
(1-9) Rotate the straight line A, e.g., clockwise by a predetermined angle Θ to obtain a straight line A1. In the figure, Θ is about 45°.
(1-10) Carry out the above described steps (1-2) through (1-8) to arrange slots on two straight lines C1 and C1' (not shown) which are perpendicular to the straight line A1 and which are in the opposite directions with respect to the center O.
(1-11) Change the rotation angle Θ to repeat the above described steps (1-9) and (1-10) until there is no blank in the outer peripheral portion of the antenna.

Furthermore, a curve passing through the point B may be prepared in place of the straight line C, and slots may be arranged thereon. While each of the numbers of straight lines C, C' and C1, C1', which are perpendicular to the straight lines A and A1, respectively, has been two, it should not be limited to two, but an optional even or odd number may be selected. When an odd number is selected, slots S1', S2', S3', S4', . . . , may be formed on, e.g., the straight line C perpendicular to the straight line A.

In the above described procedure, the values La and Lb are preferably set so that a blank region (a region wherein no slot is formed) exists in a region having a radius which is not less than the outside dimension of the inner conductor of the waveguide, preferably a region having a radius which is not less than the inner diameter of the outer conductor of the waveguide and which is not greater than the guide wavelength. Because the state of the electromagnetic field of microwaves in that region is different from that in another place, e.g., in a place apart from the center by about one wavelength. In addition, because the orientation of the vector of the electromagnetic field changes to disturb the electromagnetic field in the connecting portion of the waveguide to the flat antenna member, so that it is required to prevent slots from being provided in a region wherein the disturbance of the electromagnetic field does not converge to some extent. Moreover, because it is required to relieve the increase of the electric field of the treatment space facing the central portion of the flat antenna member ANT and to relieve the ununiformity of the density of plasma directly beneath the flat antenna member.

Furthermore, while the slots shown in FIG. 3 have a rectangular shape for convenience, the slots preferably have an elliptic shape as shown in FIG. 2. when the radius of curvature at both end portions is r, the width of each slot is 2r.

Figure 4:
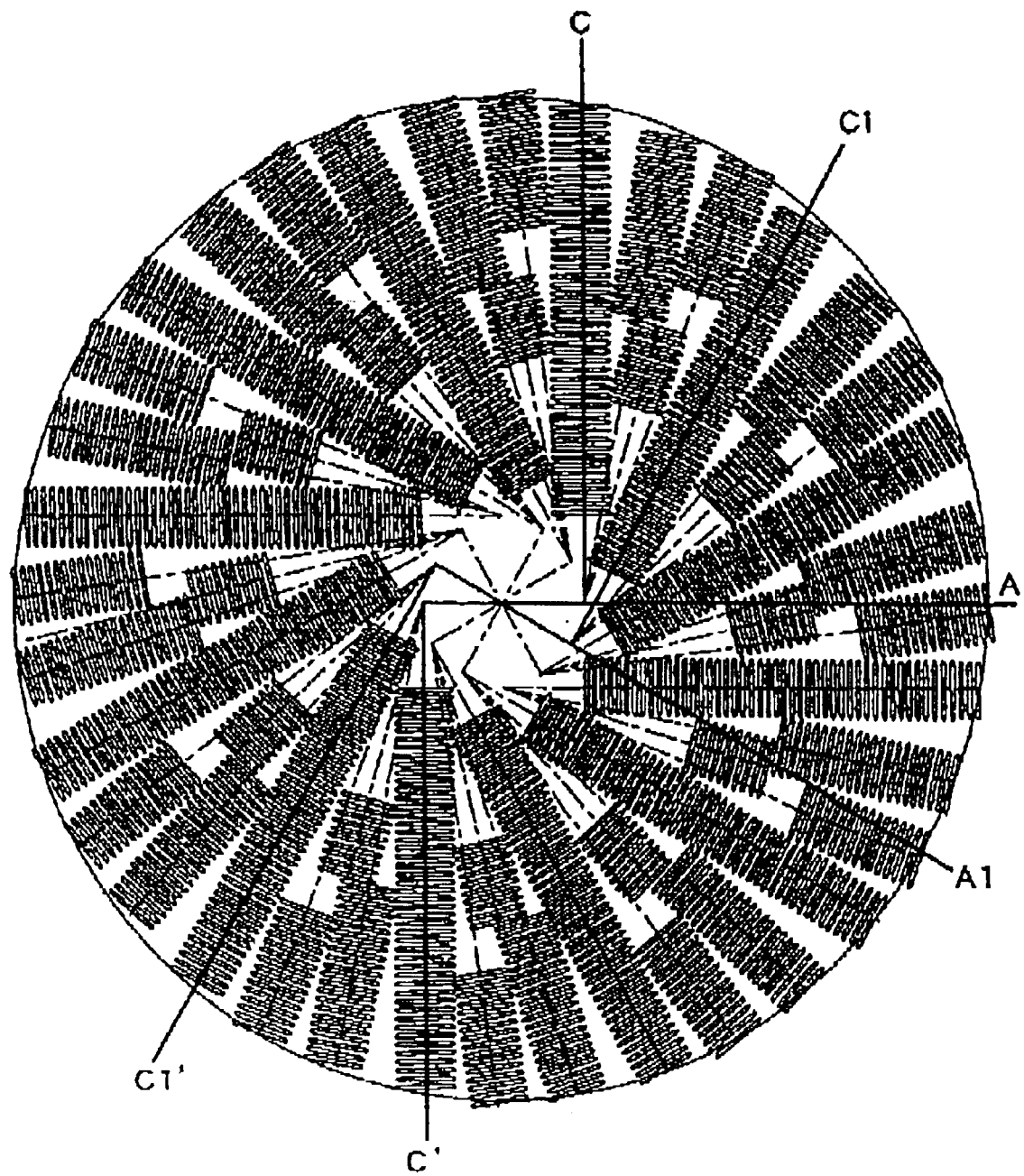
FIG. 4 is a schematic diagram showing an example of a slot pattern formed by the-procedure-of FIG. 3.

FIG. 4 shows an example of a slot pattern completed by the procedure shown in FIG. 3. In this slot pattern, slots are arranged on 48 straight lines. The 48 straight lines are divided into 12 sets of four lines. In this figure, straight lines corresponding to the straight lines A, C, C', A1, C1 and C1' of FIG. 3 are shown by thick lines, to which signs are applied (however, the straight line A1 is rotated clockwise from the straight line A by about 45° in FIG. 3, but by about 30° in FIG. 4). Each set of straight lines intersect at a region, in which no slot is formed. The center of each slot exists on the straight line, and the normal line of each slot is oriented in the same direction as that of the straight line. Furthermore, in this slot pattern, each set of four straight lines may be parallel to each other. In addition, the normal lines of slots on each straight line are not required to be oriented in the same direction. Moreover, the centers of the slots are not required to be arranged on the straight line.

Referring to FIGS. 5 through 8, slot patterns different from those in FIG. 3 and FIG. 4 will be described below. These slot patterns have the same features as the three features described referring to FIG. 3, i.e., the three features that the length of each slot is smaller than $\lambda g/2$, the slot space is smaller than $\lambda g$, and the blank region is provided in the central portion. However, the normal line of each slot may or may not pass through the central portion of the flat antenna member. These slot patterns are arranged in the following rules (2-1) through (2-9).

Furthermore, for example, the blank region of the central portion is a region facing an end opening facing the flat antenna member 44 of the waveguide 52, and the region other than the central portion of the flat antenna member 44 is a region outside the blank region.

Figure 5:
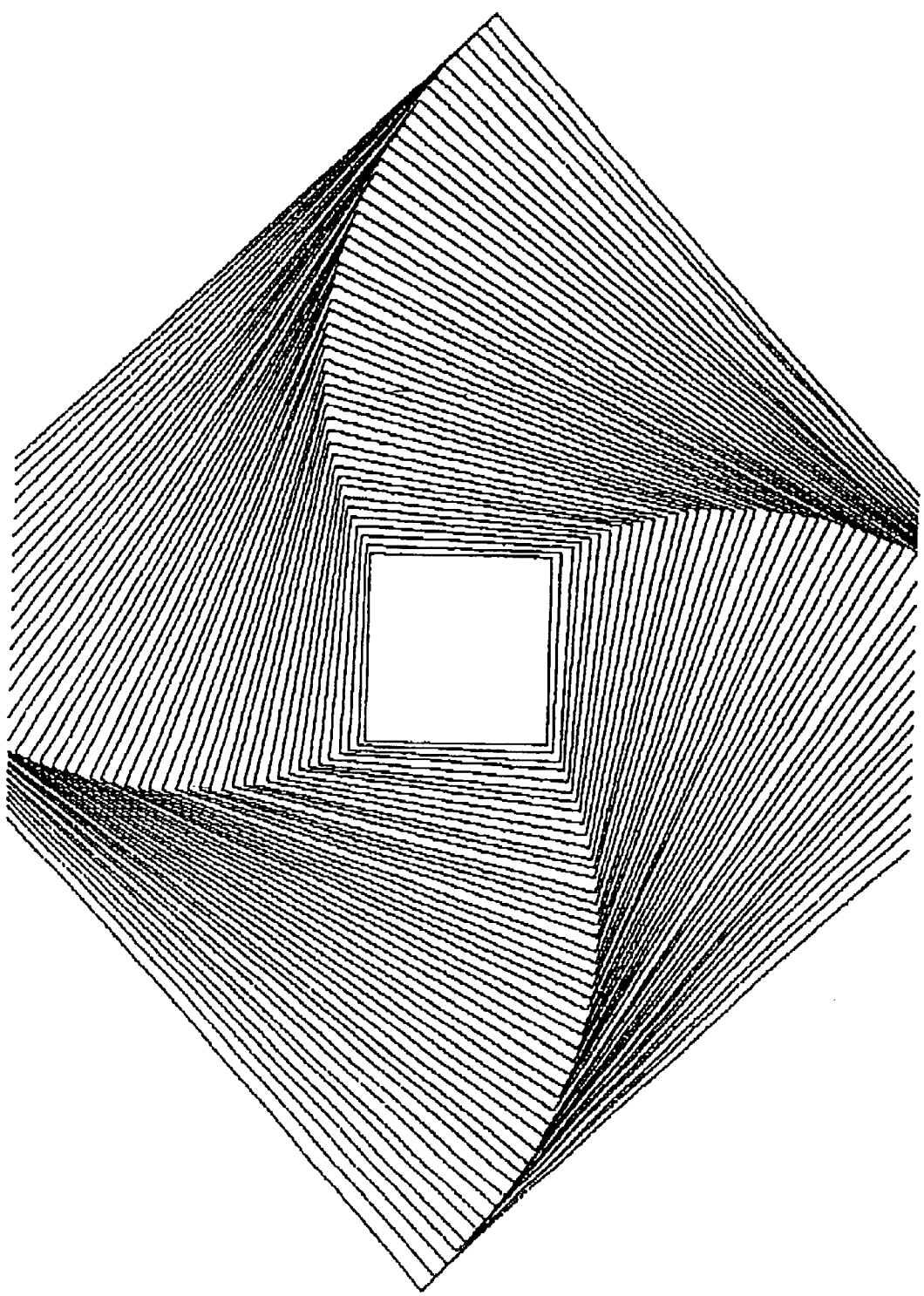
FIG. 5 is a schematic diagram for explaining a rule for forming another slot pattern.
Figure 6:
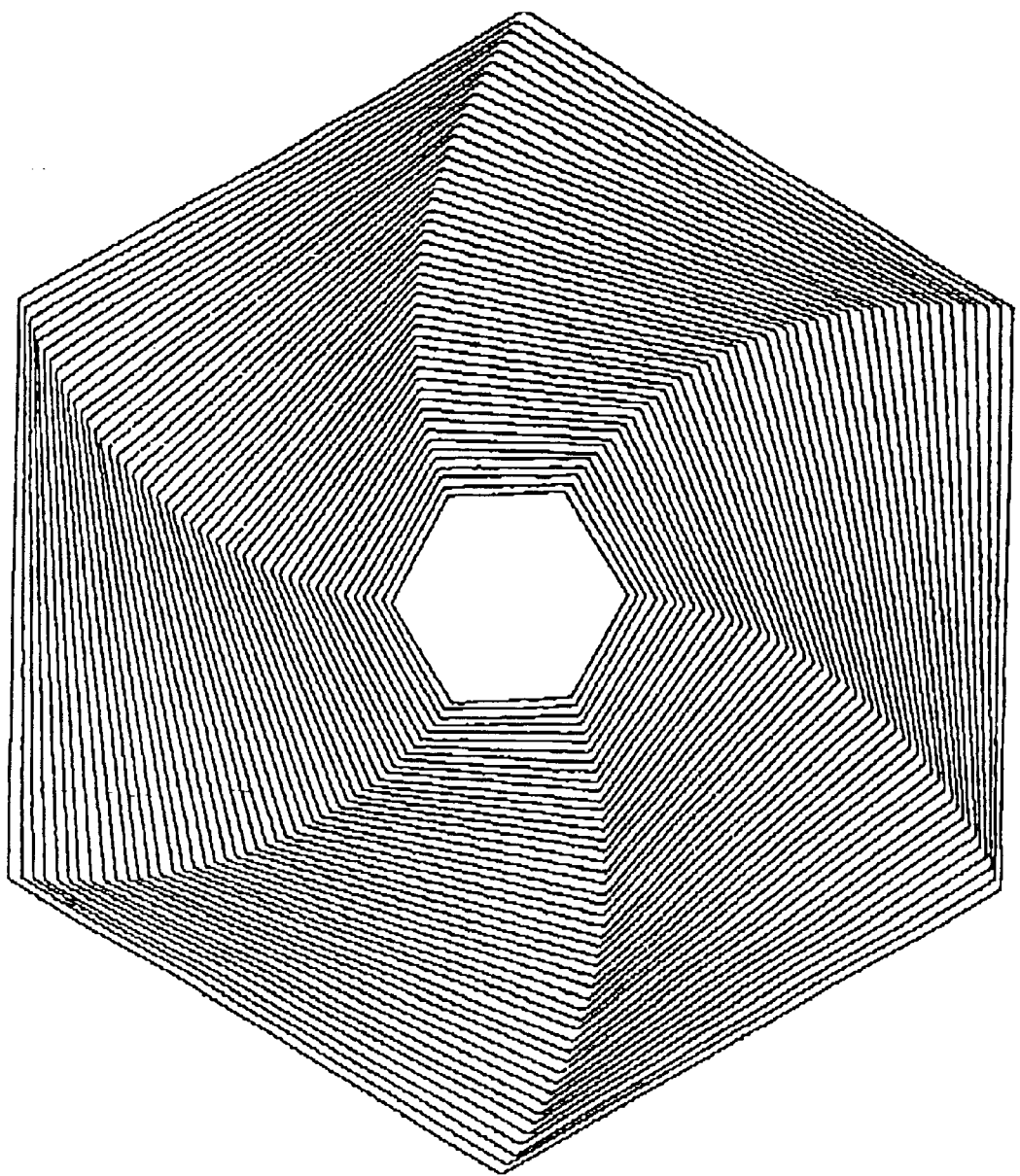
FIG. 6 is a schematic diagram for explaining a rule for forming another slot pattern.
Figure 7:
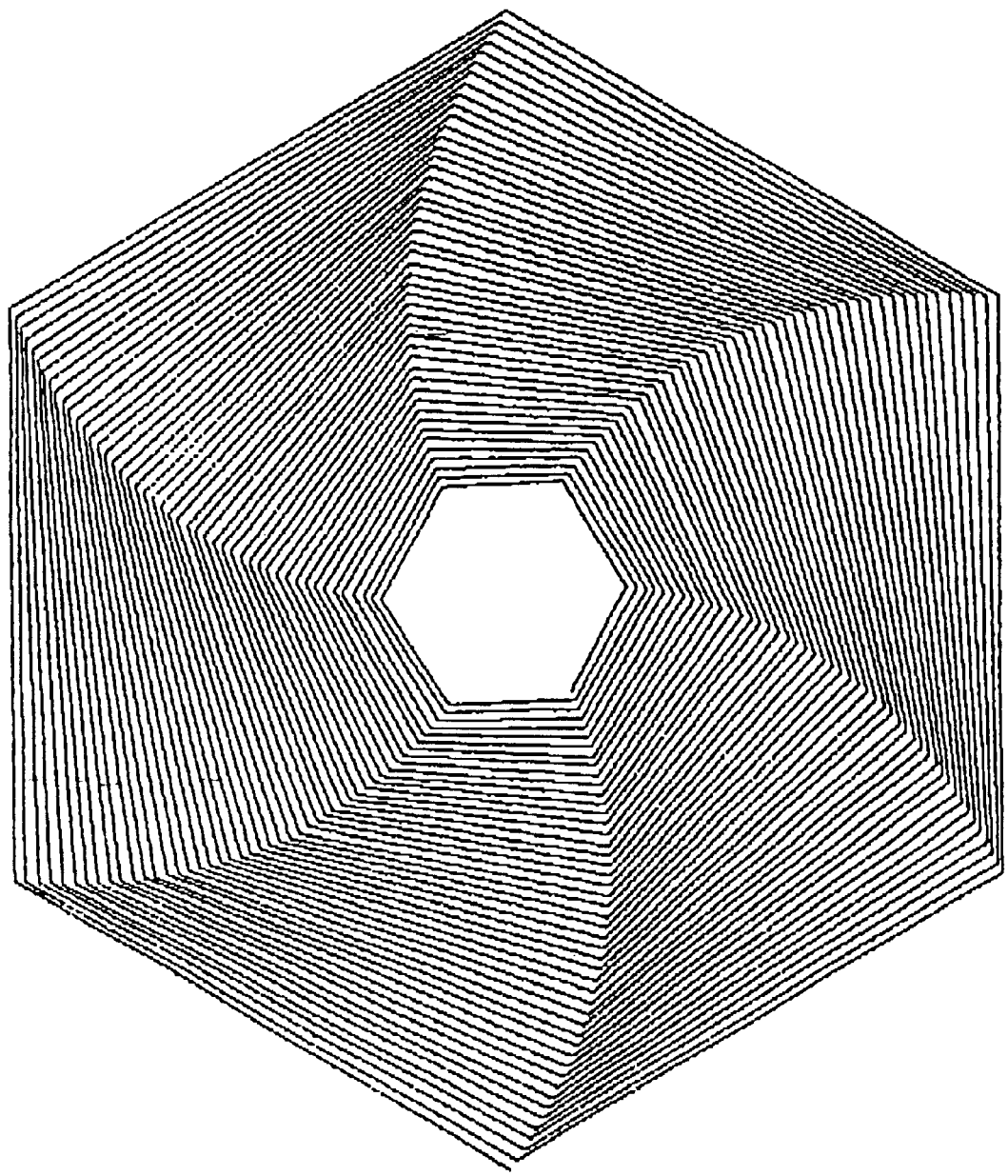
FIG. 7 is a schematic diagram for explaining a rule for forming a further slot pattern.
Figure 8:
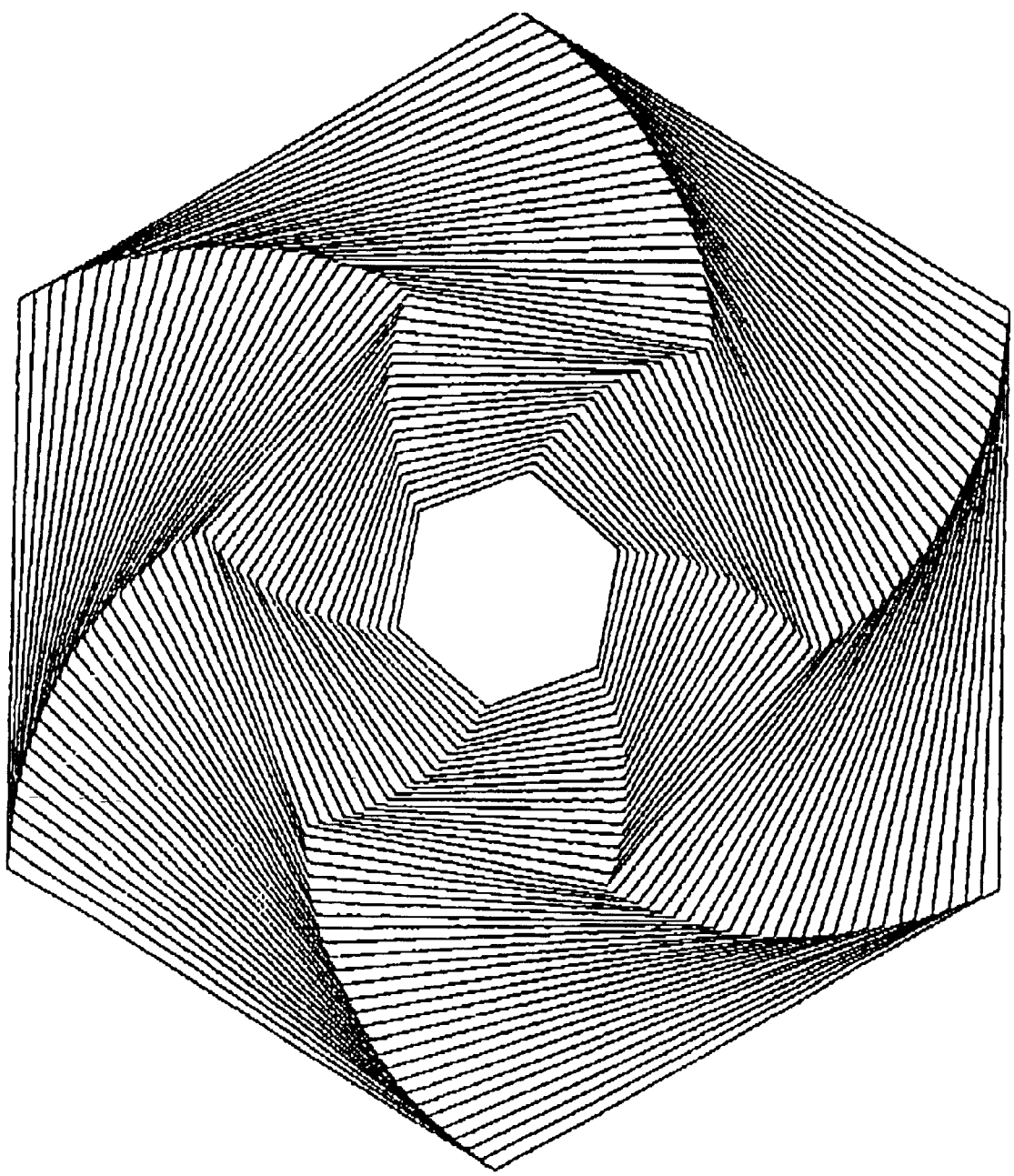
FIG. 8 is a schematic diagram for explaining a rule for forming a still further slot pattern.

(2-1) Slots are arranged on the sides of an imaginary polygon on the antenna surface of the flat antenna member. The polygon is preferably any one of a quadrangle to an octagon. FIG. 5 shows an example of a quadrangle, and FIGS. 6 through 8 show examples of hexagons.
(2-2) A common center is arranged outside of a polygon formed in the central portion of the flat antenna member, and a plurality of polygons having gradually increasing sides are formed. The space between substantially parallel two sides is set to be 50% or less of the guide wavelength $\lambda g$, preferably about 30% through 2% thereof.
(2-3) The above described space between the two sides is variable on a plane. For example, the central portion is 10% of $\lambda g$, the peripheral portion is about 3% thereof, and the portion therebetween is linearly interpolated.
(2-4) The polygons are preferably gradually rotated about the center as approaching the outside from the central portion.

The rotation angle is preferably about $\{360/2N\}°$ to $\{360/N\}°$ wherein N is the number of sides of a polygon. Therefore, assuming that the number of polygons formed on a plane is M, the difference between the rotation angles of adjacent polygons is preferably $\{360/2N \cdot M\}°$ to $\{360/N \cdot M\}°$.

In FIG. 5, polygons are rotated clockwise every 1°. In FIG. 6, polygons are rotated clockwise every 0.7°. Furthermore, in a region where the distance between the sides of adjacent polygons decreases, slots are suitably thinned out.
(2-5) The rotation of the polygons should not be limited to a simple rotation in one direction, but it may be combined with a reverse rotation. For example, when 40 hexagons are formed in a plane, the second to twentieth hexagons from the center are rotated clockwise every 3°, the twenty-first hexagon is rotated counterclockwise every 1.5°, and the twenty-second to fortieth hexagons are rotated counterclockwise every 3°.

In the pattern shown in FIG. 8, 48 hexagons are formed in a plane, the second to twenty-first hexagons from the center are rotated clockwise every 1.5°, and the twenty-second to forty-eighth hexagons from the center are rotated counterclockwise every 1.5°.

(2-6) The respective sides of polygons should not be limited to closed sides, but one side of a polygon may be connected to the vertex of the next outside polygon to continuously form sides. FIG. 7 is an example of a hexagon. Alternatively, a polygon having closed sides may be mixed with a polygon having unclosed sides in a plane.

(2-7) The shape of a plane, in which slots are formed to form a flat antenna member, is a circle or polygon. For example, in accordance with the shape of an object to be treated, the shape of the plane is set to be a circle when the object is a circular wafer, and a quadrangle when the object is a square LCD.

(2-8) The lengths of the slots may be fixed or variable in a plane. For example, the lengths of the slots may increases as approaching the peripheral portion from the central portion. Thus, it is possible to avoid the decrease of the density of plasma produced in a treatment space facing the peripheral portion.

(2-9) As described referring to FIG. 2, each slot preferably has an elliptic shape, and both end portions thereof in longitudinal directions are preferably round. The width of each slot is preferably in the range of from 1 to 4 mm. The length of each slot is preferably in the range of from 1/10 to below 1/2 of $\lambda g$.

FIGS. 9 through 13 show examples of slot patterns formed in accordance with the above described rules (2-1) through (2-9).

Figure 9:
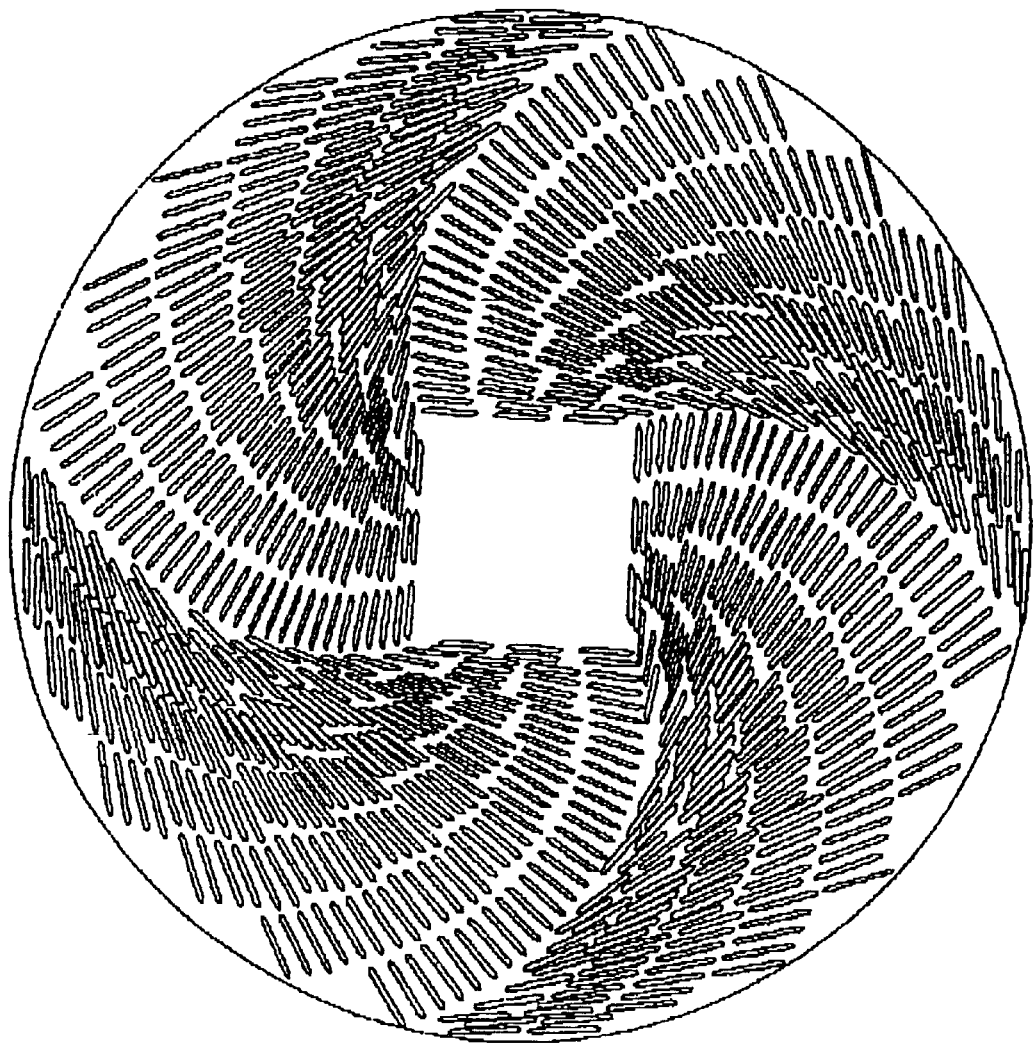
FIG. 9 is schematic diagram showing an example of a slot pattern corresponding to FIG. 5.

The slot pattern of FIG. 9 corresponds to that of FIG. 5. This pattern is formed on a circular plane. In this pattern, the sides of each quadrangle are rotated clockwise every 1° as approaching the outside.

Figure 10:
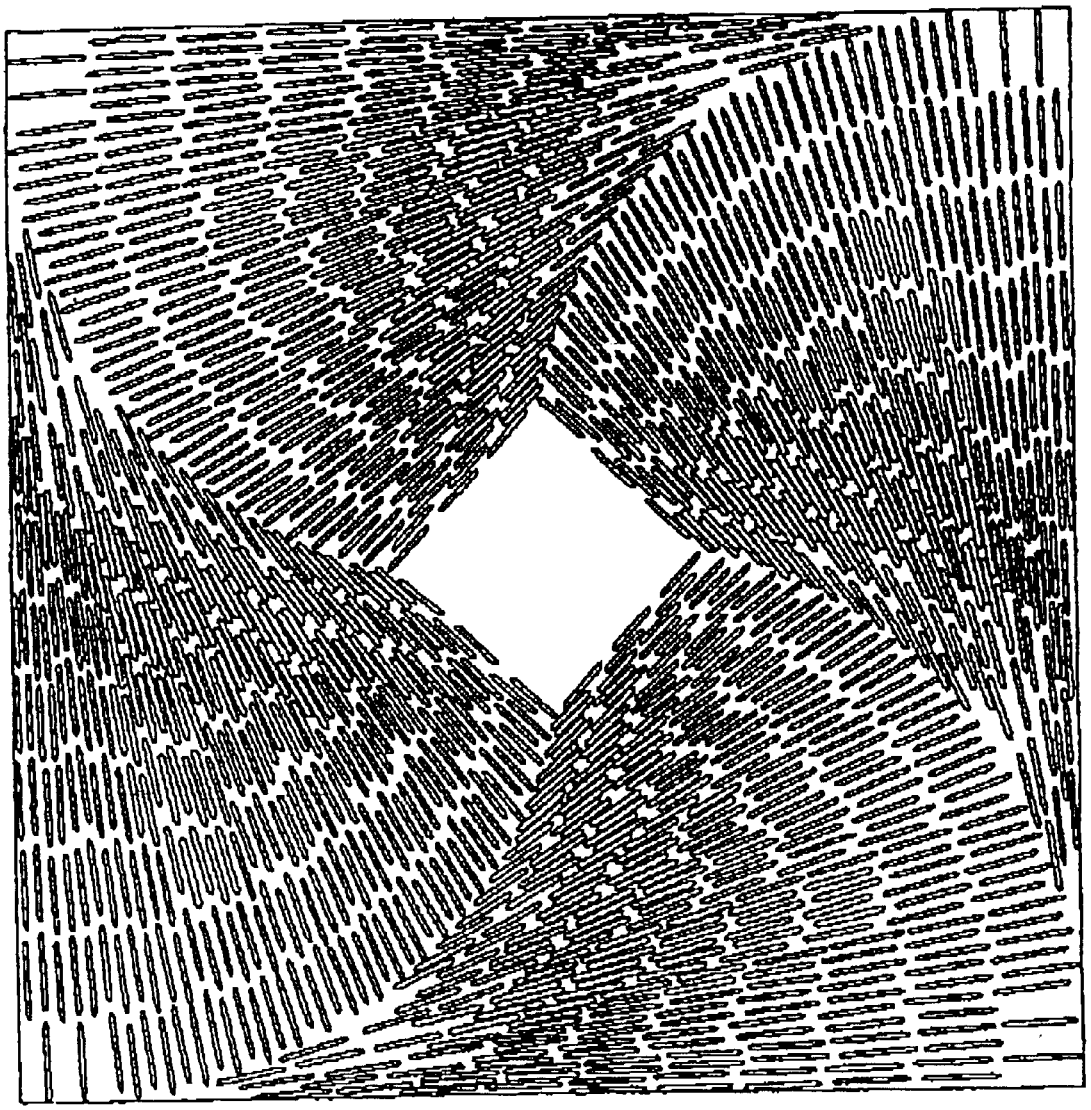
FIG. 10 is a schematic diagram showing another example of a slot pattern corresponding to FIG. 5.

The slot pattern of FIG. 10 also corresponds to that of FIG. 5. This pattern is formed on a quadrangular plane. In this pattern, the sides of each quadrangle are rotated clockwise every 1° as approaching the outside. Also in this pattern, slots formed on adjacent sides in lateral directions are alternately offset in longitudinal directions.

Figure 11:
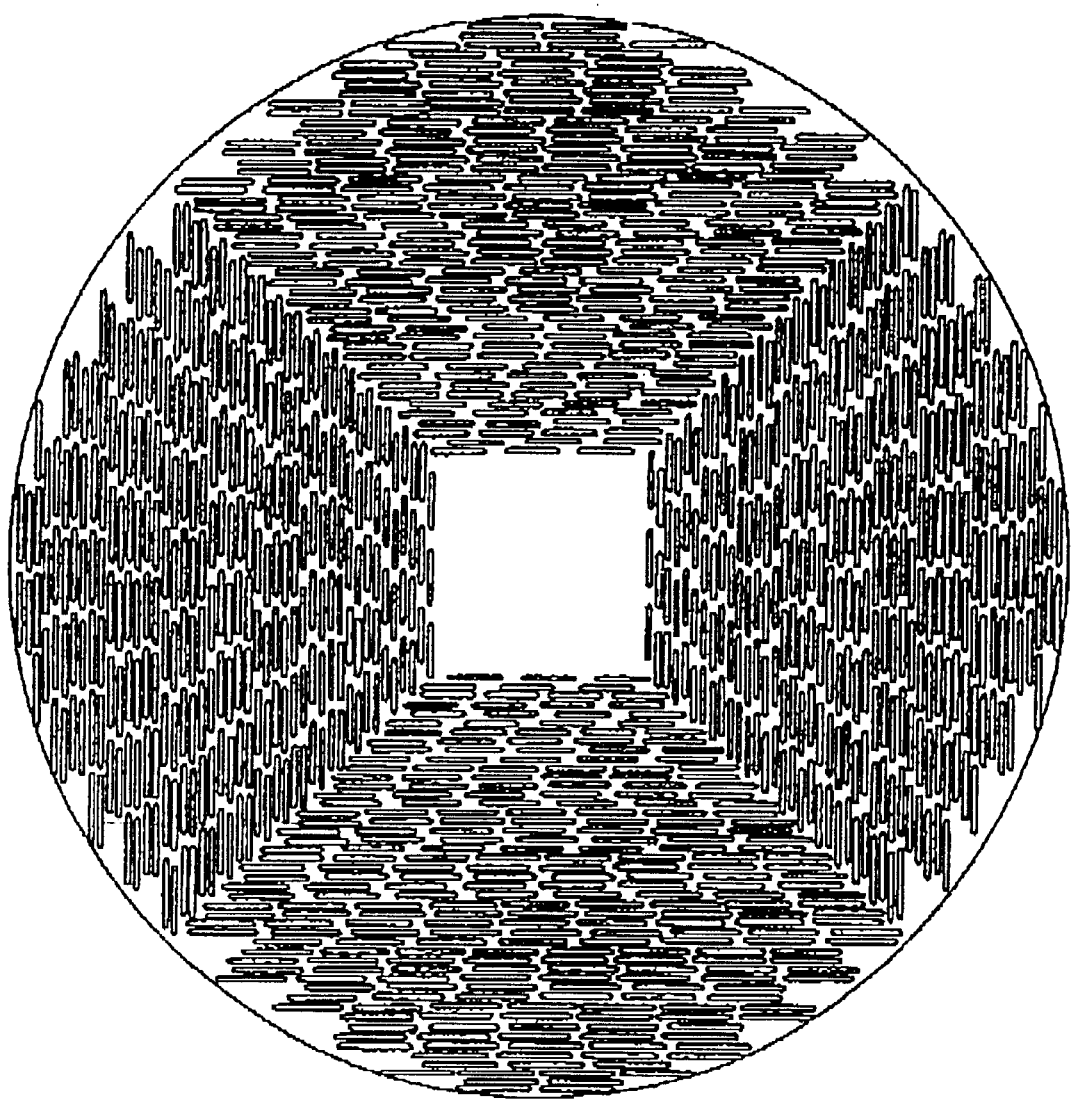
FIG. 11 is a schematic diagram showing a further example of a slot pattern corresponding to FIG. 5.

The slot pattern of FIG. 11 basically corresponds to that of FIG. 5. However, in this pattern, the sides of each quadrangle are not rotated.

Figure 12:
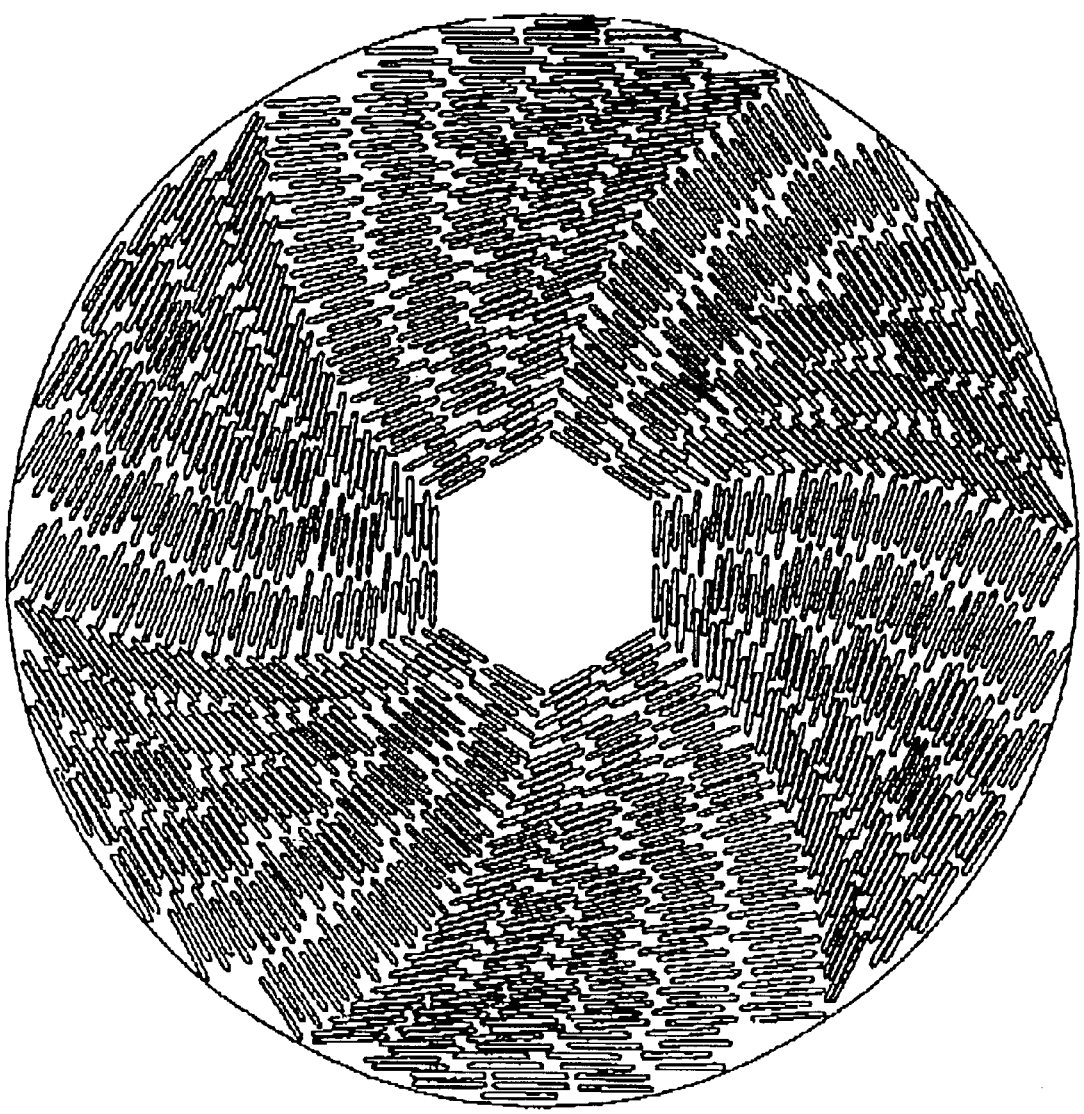
FIG. 12 is a schematic diagram showing a still further example of a slot pattern corresponding to FIG. 5.

The slot pattern of FIG. 12 corresponds to that of FIG. 6. This pattern is formed on a circular plane. In this pattern, the sides of each hexagon are rotated clockwise every 0.7° as approaching the outside. Also in this pattern, slots formed on adjacent sides in lateral directions are alternately offset in longitudinal directions.

Figure 13:
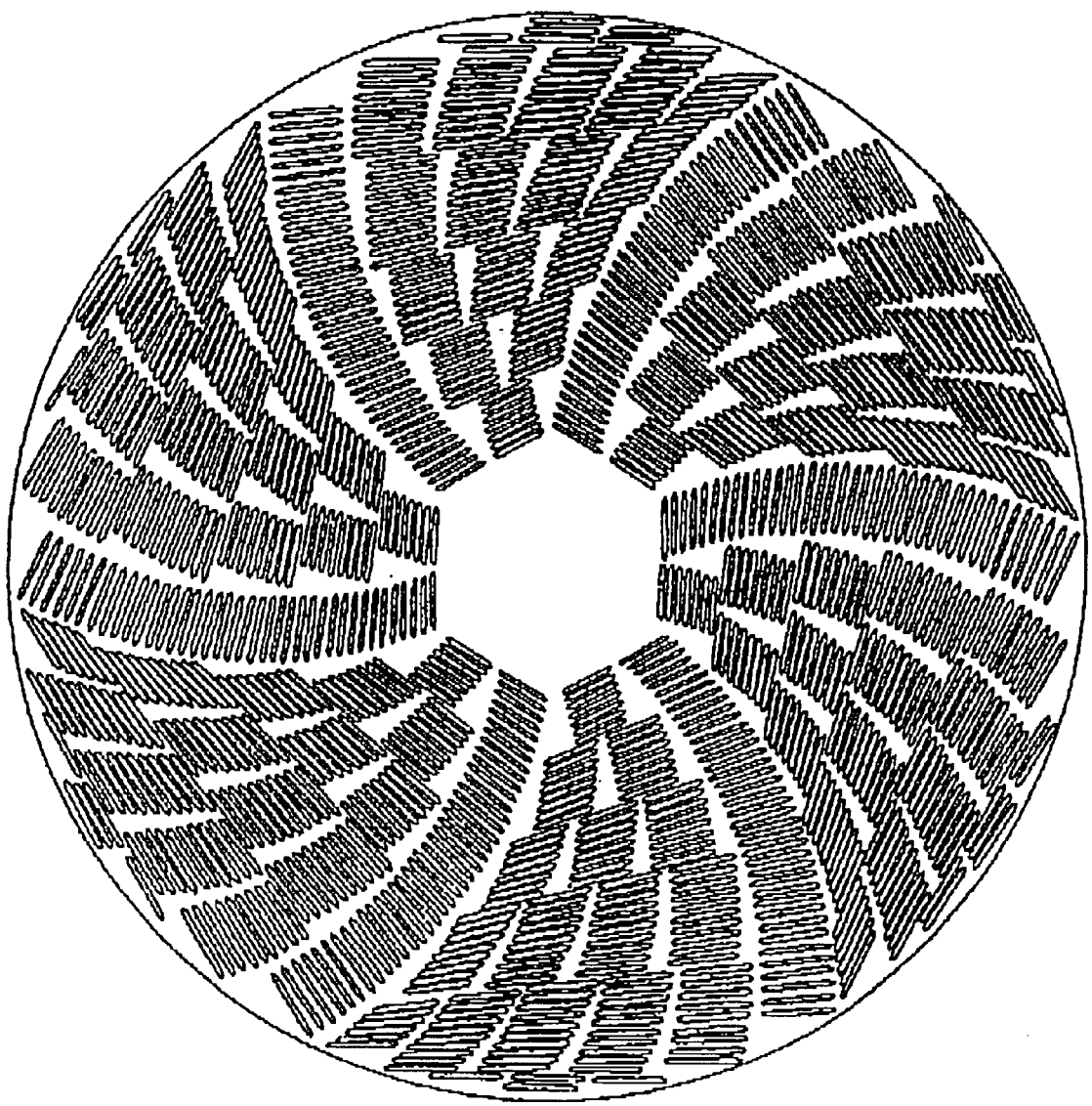
FIG. 13 is a schematic diagram showing an example of a slot pattern corresponding to FIG. 7.

The slot pattern of FIG. 13 corresponds to that of FIG. 7. This pattern is formed on a circular plane. In this pattern, the sides of each hexagon are rotated clockwise every 0.7' as approaching the outside.

Figure 14:
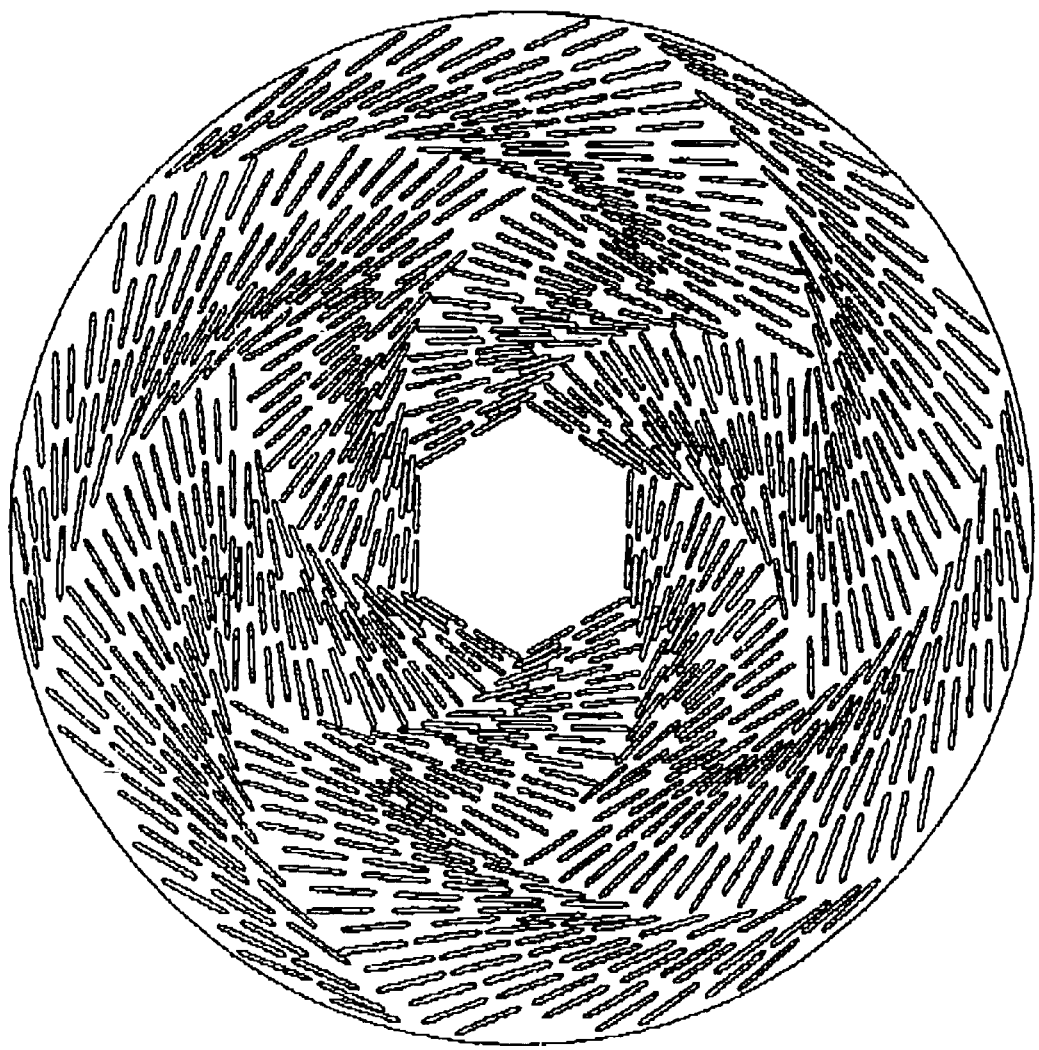
FIG. 14 is a schematic diagram showing an example of a slot pattern corresponding to FIG. 8.

The slot pattern of FIG. 14 corresponds to that of FIG. 8. This pattern is formed on a circular plane. In this pattern, the sides of the second to twenty-first hexagons are rotated clockwise every 3°, and the sides of the twenty-second to outermost hexagons are rotated counterclockwise every 3°.

Figure 15:
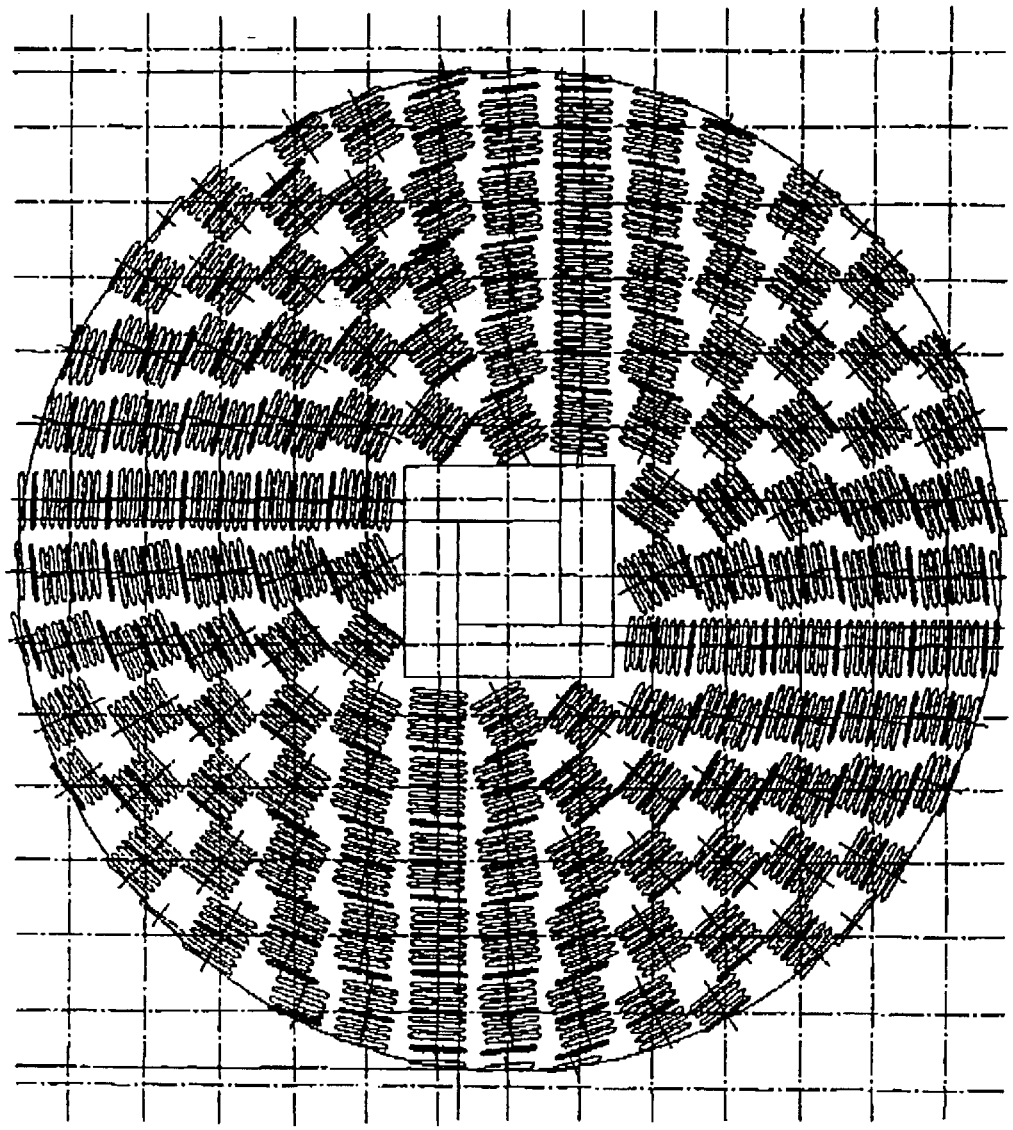
FIG. 15 is a schematic diagram showing another example of a slot pattern.

FIG. 15 shows a slot pattern which is different from the slot pattern based on the above described steps (1-1) through (1-8) and from the slot pattern based on the above described rules (2-1) through (2-9). This slot pattern also has four features that the length of each slot is shorter than $\lambda g/2$, the slot space is less than $\lambda g$, the normal line of each slot does not pass through the central portion of the flat antenna member, and the blank region is provided in the central portion.

This slot pattern is formed by the following procedure. First, an imaginary matrix pattern or check pattern is formed on a plane of a flat antenna member. That is, a plurality of parallel straight lines-are-drawn in longitudinal and lateral directions. Then, a slot is arranged on each of the intersections of the straight lines perpendicular to each other. The slot located at each of the intersections is called a center slot. The orientation of the center slot is set so that the respective normal lines do not pass through the central portion of the flat antenna member. Then, some slots are arranged on both sides of each center slot (only inside in the outer peripheral portion). The slots arranged on both sides of each center slot are oriented in the same direction as that of each center slot. The center slot and the slots on both sides thereof (only inside in the outer peripheral portion) constitute one group of slots. Furthermore, the center slot may be arranged at the center of each quadrangle formed by straight lines perpendicular to each other, not at the intersection of the straight lines, and some slots may be arranged on both sides thereof.

With the above described construction, the operation of the plasma treatment system in this preferred embodiment will be described below. First, the semiconductor wafer W is introduced into the treatment vessel 4 via the gate valve 40 by means of a transport arm, and the wafer W is mounted on the mounting top surface of the mounting table 6 by vertically moving a lifter pin (not shown).

Then, a vacuum pump is operated to hold the pressure in the treatment vessel 4 to be a predetermined process pressure, e.g., in the range of from 0.1 to tens mTorr, and the mass flow controller 28 and the shut-off valve 32 are operated to supply argon gas from the plasma gas supply nozzle 20 while controlling the flow thereof. In addition, the mass flow controller 30 and the shut-off valve 34 are operated to supply an etching gas, e.g., $CF_4$ gas, from the treatment gas supply nozzle 22 while controlling the flow thereof. Simultaneously, microwaves are supplied from the microwave generator 50 to the antenna member 44 via the waveguide 52 to form an electric field in the treatment space SP to produce plasma to carry out an etching treatment.

The microwaves of, e.g., 2.45 GHz, generated by the microwave generator 50 propagate through the coaxial waveguide 52 in a TEM mode to reach the antenna member 44 of the radial waveguide box 46. While the microwaves propagate from the center of the flat antenna member 44, which is connected to the inner cable 52B, radially to the peripheral portion, the microwaves are radiated into the upper portion of the treatment space SP directly beneath the antenna member, specifically into the plasma forming region SP10 substantially in radial directions, via the large number of slots 60 formed in the antenna member 44. In addition, the microwaves which are radiated from the slots 60 and which are reflected on the radial edges of the flat antenna member (the inner wall surface of the radial waveguide box 46) to be returned are also radiated to the plasma forming region SP10 substantially in radial directions. Since substantially radially radiated microwaves have an electric field component perpendicular to the plane of the flat antenna member 44, argon gas excited by the electric field component is activated as plasma to be diffused in the process region SP20 to activate the treatment gas to form active species to treat, e.g., to etch, the wafer W with the active species.

In this preferred embodiment, since the length of each slot, the space between the slots, and the orientation of each slot are set as described above, the microwaves reflected on the radial edges of the flat antenna member to be returned are radiated substantially radially inside via the slots. However, since the arrangement of the slots is not axisymmetric, it is possible to relieve the increase of the electric field in the plasma forming region SP10 facing the central portion of the flat antenna member. In addition, since the arrangement of the slots is not axisymmetric, the microwaves supplied from the inner conductor 52B of the waveguide 52 to the center of the flat antenna member 44 propagate in directions offset from the radial directions of the flat antenna member 44 when being radiated into the treatment space through the slots. Thus, it is possible to avoid the resonance between microwaves within the radial waveguide box 46 and microwaves radiated through the slot into the closed, treatment space SP, so that it is possible to relieve the ununiformity of the density of plasma directly beneath the flat antenna member 44. As a result, it is possible to produce uniform plasma in the process region SP20.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A plasma treatment system comprising:
   an airtight treatment vessel housing therein a mounting table for mounting thereon an object to be treated;
   a microwave generating device for generating a microwave;
   a microwave introducing device for introducing said microwave into said treatment vessel; and
   a flat antenna member which is connected to said microwave introducing device and which faces said mounting table, said flat antenna member having a plurality of slots in a region other than a central portion of said flat antenna member, said slots being arranged so as not to be axisymmetric with respect to an axis passing through the center of said flat antenna member, a slot space for two of said slots being shorter than a wavelength of said microwave in said microwave introducing device, and each of said slots having a length shorter than half of said wavelength,
   wherein said slots are arranged so that a normal line of each of said slots does not pass through said central portion of said flat antenna member and said slots are arranged on and perpendicular to a plurality of straight lines which are imaginatively formed on a plane of said flat antenna member and which do not pass through said central portion of said flat antenna member.

2. A plasma treatment system as set forth in claim 1, wherein said microwave introducing device is a coaxial waveguide.

3. A plasma treatment system as set forth in claim 2, wherein said microwave introducing device has an end opening for allowing said microwave to be radiated toward said flat antenna member, and said region other than the central portion of said flat antenna member is a region outside a region facing said end opening.

4. A plasma treatment system as set forth in claim 1, wherein said slots are arranged on said straight lines so that the orientation of said normal line of each of said slots is the same as those of said straight lines.

5. A plasma treatment system as set forth in claim 1, wherein said plurality of slots have different lengths.

6. A plasma treatment system comprising:
   an airtight treatment vessel housing therein a mounting table for mounting thereon an object to be treated;
   a microwave generating device for generating a microwave;
   a microwave introducing device for introducing said microwave into said treatment vessel; and
   a flat antenna member which is connected to said microwave introducing device and which faces said mounting table, said flat antenna member having a plurality of slots in a region other than a central portion of said flat antenna member, said slots being arranged so as not to be axisymmetric with respect to an axis passing through the center of said flat antenna member, a slot space for two of said slots being shorter than a wavelength of said microwave in said microwave introducing device, and each of said slots having a length shorter than half of said wavelength,
   wherein said slots are arranged so that a normal line of each of said slots does not pass through said central portion of said flat antenna member and said plurality of slots comprise a group of slots arranged in the form of a matrix on a plane of said flat antenna member.

* * * * *